US011515152B2

(12) United States Patent
Kogura et al.

(10) Patent No.: US 11,515,152 B2
(45) Date of Patent: Nov. 29, 2022

(54) METHOD OF MANUFACTURING SEMICONDUCTOR DEVICE, SUBSTRATE PROCESSING APPARATUS, AND METHOD OF PROCESSING SUBSTRATE

(71) Applicant: KOKUSAI ELECTRIC CORPORATION, Tokyo (JP)

(72) Inventors: Shintaro Kogura, Toyama (JP); Kazuhiro Harada, Toyama (JP); Shogo Otani, Toyama (JP); Koichi Honda, Toyama (JP); Mamoru Umemoto, Toyama (JP); Kazuhiro Shimoda, Toyama (JP); Akihito Yoshino, Toyama (JP); Naoko Kitagawa, Toyama (JP); Kenji Kameda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 247 days.

(21) Appl. No.: 16/878,242

(22) Filed: May 19, 2020

(65) Prior Publication Data
US 2020/0373150 A1   Nov. 26, 2020

(30) Foreign Application Priority Data

May 21, 2019   (JP) .............................. JP2019-095087

(51) Int. Cl.
*H01L 21/02*   (2006.01)
*C23C 16/36*   (2006.01)
(Continued)

(52) U.S. Cl.
CPC .......... *H01L 21/0228* (2013.01); *C23C 16/36* (2013.01); *C23C 16/4405* (2013.01);
(Continued)

(58) Field of Classification Search
None
See application file for complete search history.

(56) References Cited

U.S. PATENT DOCUMENTS

2015/0041430 A1\*   2/2015   Yoshino .............. C23C 16/4405
                                                        216/37
2015/0376781 A1    12/2015   Kogura et al.
(Continued)

FOREIGN PATENT DOCUMENTS

CN         105225926 A      1/2016
JP         2009-197274 A    9/2009
(Continued)

OTHER PUBLICATIONS

Taiwanese Office Action dated Sep. 7, 2021 for Taiwanese Patent Application No. 109111105.
(Continued)

*Primary Examiner* — Asok K Sarkar
(74) *Attorney, Agent, or Firm* — Volpe Koenig

(57) ABSTRACT

There is provided a technique that includes forming a film on a substrate by performing a cycle a predetermined number of times, the cycle including: (a) supplying a precursor gas to the substrate in a process container of a substrate processing apparatus via a first pipe made of metal; (b) supplying an oxygen-containing gas to the substrate in the process container via a second pipe made of metal, wherein a fluorine-containing layer is continuously formed on an inner surface of the second pipe; and (c) supplying a nitrogen-and-hydrogen-containing gas to the substrate in the process container via the second pipe.

16 Claims, 8 Drawing Sheets

(51) Int. Cl.
      *C23C 16/44*      (2006.01)
      *C23C 16/455*     (2006.01)
      *H01L 21/673*     (2006.01)

(52) U.S. Cl.
      CPC .. *C23C 16/45574* (2013.01); *H01L 21/02126* (2013.01); *H01L 21/67309* (2013.01)

(56) References Cited

U.S. PATENT DOCUMENTS

| | | |
|---|---|---|
| 2016/0244875 A1 | 8/2016 | Sasajima et al. |
| 2018/0105701 A1 | 4/2018 | Larsson et al. |

FOREIGN PATENT DOCUMENTS

| | | |
|---|---|---|
| JP | 2016-012701 A | 1/2016 |
| JP | 2016-157871 A | 9/2016 |
| KR | 10-1749398 B1 | 6/2017 |
| TW | 201817915 A | 5/2018 |

OTHER PUBLICATIONS

Japanese Office Action dated Aug. 31, 2021 for Japanese Patent Application No. 2019-095087.
Korean Office Action dated Nov. 26, 2021 for Korean Patent Application No. 10-2020-0060125.

\* cited by examiner

FIG. 8

| Condition | Condition for forming metal fluoride layer | | Pipe made of SUS | | Pipe made of Hastelloy | |
|---|---|---|---|---|---|---|
| | Pipe temperature (°C) | Supply time of F₂ gas (min.) | Thickness of metal fluoride layer | Pipe damage after film formation | Thickness of metal fluoride layer | Pipe damage after film formation |
| 1 | 25~100 | 100~200 | × | ◯ | × | ◯ |
| 2 | 200~250 | 100~200 | × | × | ◯ | ◯ |
| 3 | 150~180 | 200~400 | ◯ | ◯ | — | — |

METHOD OF MANUFACTURING SEMICONDUCTOR DEVICE, SUBSTRATE PROCESSING APPARATUS, AND METHOD OF PROCESSING SUBSTRATE

CROSS-REFERENCE TO RELATED APPLICATION

This application is based upon and claims the benefit of priority from Japanese Patent Application No. 2019-095087, filed on May 21, 2019, the entire contents of which are incorporated herein by reference.

TECHNICAL FIELD

The present disclosure relates to a method of manufacturing a semiconductor device, a substrate processing apparatus, and a recording medium.

BACKGROUND

In a related art, as a process of manufacturing a semiconductor device, a process of processing a substrate in a process container is often carried out.

SUMMARY

The present disclosure provides some embodiments of a technique capable of improving a quality of substrate processing performed in a process container.

According to one or more embodiments of the present disclosure, there is provided a technique that includes forming a film on a substrate by performing a cycle a predetermined number of times, the cycle including: (a) supplying a precursor gas to the substrate in a process container of a substrate processing apparatus via a first pipe made of metal; (b) supplying an oxygen-containing gas to the substrate in the process container via a second pipe made of metal, wherein a fluorine-containing layer is continuously formed on an inner surface of the second pipe; and (c) supplying a nitrogen-and-hydrogen-containing gas to the substrate in the process container via the second pipe.

BRIEF DESCRIPTION OF DRAWINGS

FIG. 8 is a diagram illustrating observation results of inner surfaces of pipes when a SiOCN film is formed on a wafer by supplying $O_2$ gas and $NH_3$ gas, using a pipe made of SUS and a pipe made of Hastelloy (registered trademark) in which a metal fluoride layer is formed on their respective inner surfaces under a plurality of different conditions.

DETAILED DESCRIPTION

One or More Embodiments of the Present Disclosure

One or more embodiments of the present disclosure will now be mainly described with reference to FIGS. 1 to 6.

(1) Configuration of Substrate Processing Apparatus

Figure 1:
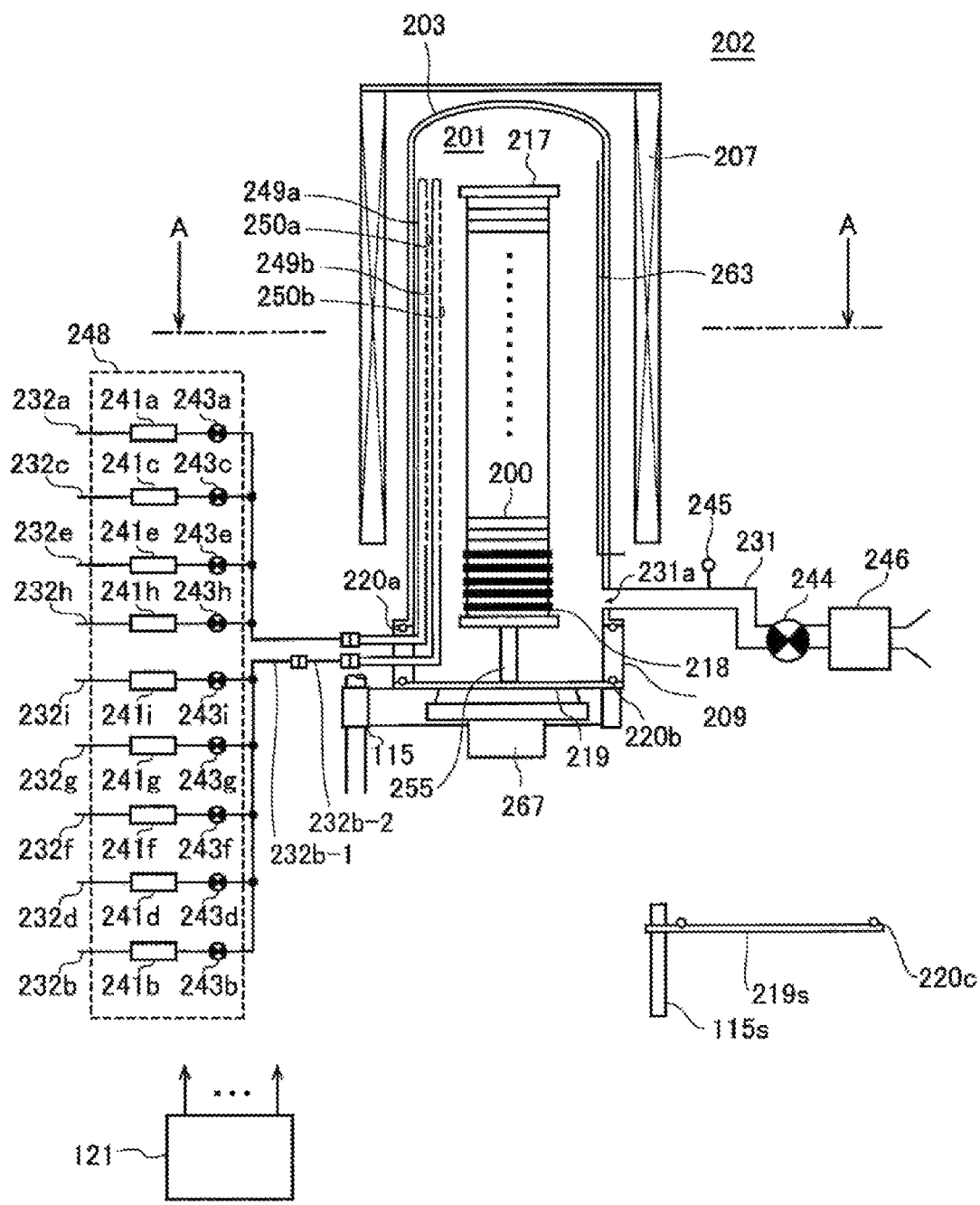
FIG. 1 is a schematic configuration diagram of a vertical type process furnace of a substrate processing apparatus suitably used in some embodiments of the present disclosure, in which a portion of the process furnace is shown in a vertical cross sectional view.

As illustrated in FIG. 1, a process furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of, for example, a heat resistant material such as quartz ($SiO_2$), silicon carbide (SiC), or the like, and has a cylindrical shape with its upper end closed and its lower end opened. A manifold 209 is disposed below the reaction tube 203 in a concentric relationship with the reaction tube 203. The manifold 209 is made of, for example, a metal material such as stainless steel (SUS), and has a cylindrical shape with its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate wafers 200 as substrates. Processing on the wafers 200 is performed in the process chamber 201.

Nozzles 249a and 249b as first and second suppliers are installed in the process chamber 201 so as to penetrate a sidewall of the manifold 209. The nozzles 249a and 249b are also referred to as a first nozzle and a second nozzle, respectively. The nozzles 249a and 249b are each made of, for example, a heat resistant material which is a non-metallic material such as quartz, SiC, or the like. The nozzles 249a and 249b are configured as common nozzles used for supplying plural kinds of gases, respectively.

Gas supply pipes 232a and 232b as first and second pipes are connected to the nozzles 249a and 249b, respectively.

The gas supply pipes 232a and 232b are configured as common pipes used for supplying plural kinds of gases, respectively. Mass flow controllers (MFCs) 241a and 241b, which are flow rate controllers (flow rate control parts), and valves 243a and 243b, which are opening/closing valves, are installed in the gas supply pipes 232a and 232b sequentially from upstream sides of gas flow, respectively. Gas supply pipes 232c, 232e and 232h are respectively connected to the gas supply pipe 232a at a downstream side of the valve 243a. MFCs 241c, 241e and 241h and valves 243c, 243e and 243h are installed in the gas supply pipes 232c, 232e and 232h sequentially from upstream sides of gas flow, respectively. Gas supply pipes 232d, 232f, 232g and 232i are respectively connected to the gas supply pipe 232b at a downstream side of the valve 243b. MFCs 241d, 241f, 241g and 241i and valves 243d, 243f, 243g and 243i are installed in the gas supply pipes 232d, 232f, 232g and 232i sequentially from upstream sides of gas flow, respectively.

The gas supply pipes 232a to 232i are made of a metal material containing iron (Fe) and nickel (Ni). The material of the gas supply pipes 232a to 232i may contain Fe, Ni, and chromium (Cr), or may contain Fe, Ni, Cr, and molybdenum (Mo). That is, as the material of the gas supply pipes 232a to 232i, it may be possible to suitably use, for example, Hastelloy (registered trademark) that has improved heat resistance and corrosion resistance by adding Fe, Mo, Cr, or the like to Ni, Inconel (registered trademark) with enhanced heat resistance and corrosion resistance by adding Fe, Cr, niobium (Nb), Mo, or the like to Ni, or the like, as well as SUS. Furthermore, the material of the manifold 209 described above and materials of a seal cap 219, a rotary shaft 255, and an exhaust pipe 231 as described hereinbelow may be similar to those of the gas supply pipes 232a to 232i.

Figure 2:
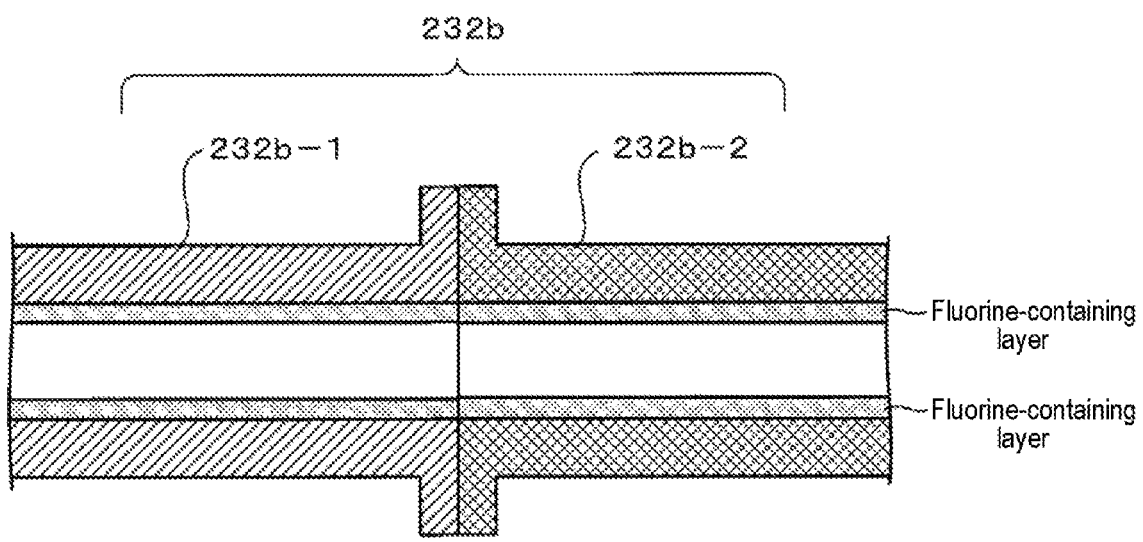
FIG. 2 is a cross sectional view of a second pipe made of metal installed in the substrate processing apparatus according to some embodiments of the present disclosure.

As illustrated in FIG. 2, the gas supply pipe 232b according to the present embodiments includes a gas supply pipe 232b-1 as a first part and a gas supply pipe 232b-2 as a second part. The gas supply pipe 232b-1 includes a metal material containing Fe, Ni, and Cr as a first material. As the material of the gas supply pipe 232b-1, it may be possible to suitably use SUS or the like. The gas supply pipe 232b-2 includes a metal material containing Fe, Ni, Cr, and Mo as a second material. As the material of the gas supply pipe 232b-2, it may be possible to suitably use Hastelloy or the like.

A fluorine (F)-containing layer is formed on respective inner surfaces of the gas supply pipes 232b-1 and 232b-2. The formation of the F-containing layer on the inner surface of the gas supply pipe 232b-1 and the formation of the F-containing layer on the inner surface of the gas supply pipe 232b-2 may be performed separately under different conditions, with the gas supply pipe 232b separated into the gas supply pipe 232b-1 and the gas supply pipe 232b-2. Then, the gas supply pipes 232b-1 and 232b-2 in which the F-containing layer is formed on the respective inner surfaces separately under different conditions are installed in a substrate processing apparatus. In this operation, the gas supply pipe 232b-1 and the gas supply pipe 232b-2 are connected (coupled) so as to be in a fixed state.

When the gas supply pipes 232b-1 and 232b-2 are installed in the substrate processing apparatus, the gas supply pipe 232b-1 is disposed at a position farther from the process container than the gas supply pipe 232b-2 and the gas supply pipe 232b-2 is disposed at a position closer to the process container than the gas supply pipe 232b-1. That is, the gas supply pipe 232b-2 made of Hastelloy, which is higher in heat resistance and corrosion resistance than SUS, is used as the pipe closer to the process container which may be easily affected by heat from the process container. Furthermore, the gas supply pipe 232b-1 made of SUS, which is lower in heat resistance and corrosion resistance than Hastelloy, is used as the pipe farther from the process container which may be hardly affected by heat from the process container.

That is, the F-containing layer is formed on the respective inner surfaces of the gas supply pipes 232b-1 and 232b-2 by supplying a F-containing gas to the respective inner surfaces of the gas supply pipes 232b-1 and 232b-2 before installing the gas supply pipes 232b-1 and 232b-2 in the substrate processing apparatus. As the F-containing gas, it may be possible to use, for example, fluorine ($F_2$) gas. A method for forming the F-containing layer will be described later.

Figure 3:
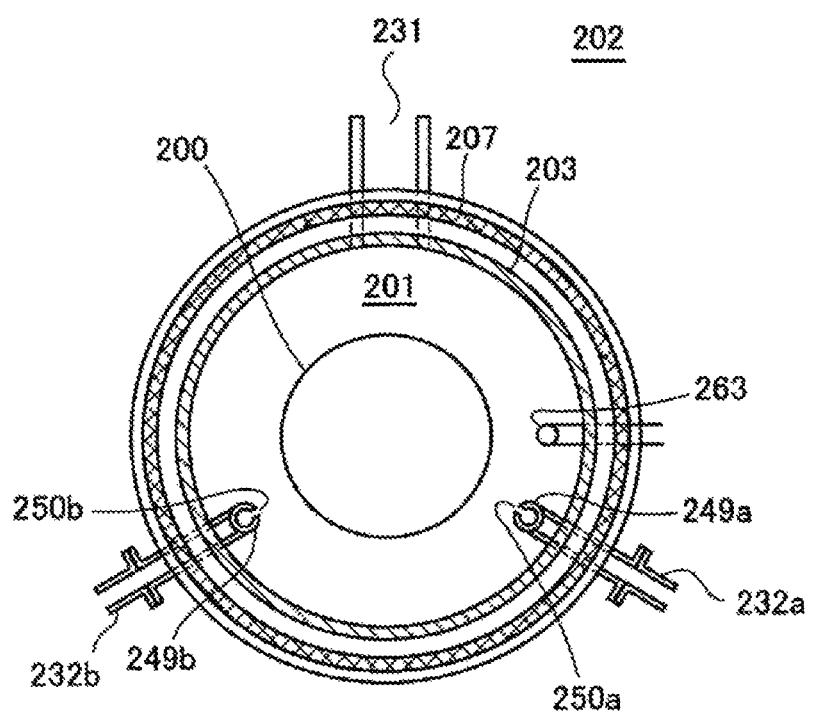
FIG. 3 is a schematic configuration diagram of the vertical type process furnace of the substrate processing apparatus suitably used in some embodiments of the present disclosure, in which a portion of the process furnace is shown in a cross sectional view taken along line A-A in FIG. 1.

As illustrated in FIG. 3, each of the nozzles 249a and 249b is disposed in a space with an annular shape (in a plane view) between an inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, each of the nozzles 249a and 249b is installed at a lateral side of a wafer arrangement region in which the wafers 200 are arranged, namely in a region which horizontally surrounds the wafer arrangement region, along the wafer arrangement region. Gas supply holes 250a and 250b for supplying gas are installed on side surfaces of the nozzles 249a and 249b, respectively. Each of the gas supply holes 250a and 250b is opened toward the center of the wafers 200 in a plan view, to allow the gas to be supplied toward the wafers 200. The gas supply holes 250a and 250b may be installed in a plural number between the lower portion of the reaction tube 203 and the upper portion of the reaction tube 203.

A precursor gas, for example, a halosilane-based gas which contains silicon (Si) as a main element (predetermined element) constituting a film and a halogen element, is supplied from the gas supply pipe 232a into the process chamber 201 via the MFC 241a, the valve 243a, and the nozzle 249a. The precursor gas refers to a gaseous precursor, for example, gas obtained by vaporizing a precursor which remains in a liquid state under a room temperature and an atmospheric pressure, or a precursor which remains in a gas state under a room temperature and an atmospheric pressure. The halosilane refers to a silane including a halogen group. The halogen group includes a chloro group, a fluoro group, a bromo group, an iodo group, and the like. That is, the halogen group includes a halogen element such as chlorine (Cl), fluorine (F), bromine (Br), iodine (I), or the like. As the halosilane-based gas, it may be possible to use, for example, a precursor gas containing Si and Cl, i.e., a chlorosilane-based gas. The chlorosilane-based gas acts as a Si source. As the chlorosilane-based gas, it may be possible to use, for example, hexachlorodisilane ($Si_2Cl_6$, abbreviation: HCDS) gas. The HCDS gas is a gas containing an element (Si) which becomes solid alone under the aforementioned processing conditions, i.e., a gas which can deposit a film alone under the aforementioned processing conditions.

An oxygen (O)-containing gas as a reaction gas is supplied from the gas supply pipe 232b into the process chamber 201 via the MFC 241b, the valve 243b, and the nozzle 249b. As the O-containing gas, it may be possible to use, for example, oxygen ($O_2$) gas.

A carbon (C)-containing gas as a reaction gas is supplied from the gas supply pipe 232c into the process chamber 201 via the MFC 241c, the valve 243c, the gas supply pipe 232a, and the nozzle 249a. As the C-containing gas, it may be possible to use, for example, propylene ($C_3H_6$) gas which is a hydrocarbon-based gas.

A nitrogen (N)-and-hydrogen (H)-containing gas as a reaction gas is supplied from the gas supply pipe 232d into the process chamber 201 via the MFC 241d, the valve 243d, the gas supply pipe 232b, and the nozzle 249b. As the N-and-H-containing gas, it may be possible to use, for example, ammonia ($NH_3$) gas which is a hydrogen nitride-based gas.

A cleaning gas is supplied from the gas supply pipes 232e and 232f into the process chamber 201 via the MFCs 241e and 241f, the valves 243e and 243f, the gas supply pipes 232a and 232b, and the nozzles 249a and 249b, respectively. The cleaning gas acts as a cleaning gas in each of chamber cleaning, first nozzle cleaning, and second nozzle cleaning, which are initial cleanings as described hereinbelow. As the cleaning gas, it may be possible to use, for example, chlorine trifluoride ($ClF_3$) gas.

A nitrogen oxide-based gas as an additive gas is supplied from the gas supply pipe 232g into the process chamber 201 via the MFC 241g, the valve 243g, the gas supply pipe 232b, and the nozzle 249b. The nitrogen oxide-based gas alone does not show a cleaning effect, but acts to improve the cleaning effect of the cleaning gas by reacting with the cleaning gas in the chamber cleaning as described hereinbelow to generate active species such as, e.g., fluorine radicals, nitrosyl halide compounds, or the like. As the nitrogen oxide-based gas, it may be possible to use, for example, nitrogen monoxide (NO) gas.

An inert gas, for example, nitrogen ($N_2$) gas, is supplied from the gas supply pipes 232h and 232i into the process chamber 201 via the MFC 241h and 241i, the valves 243h and 243i, the gas supply pipes 232a and 232b, and the nozzles 249a and 249b, respectively. The $N_2$ gas acts as a purge gas, a carrier gas, a dilution gas, or the like.

A precursor gas supply system mainly includes the gas supply pipe 232a, the MFC 241a, the valve 243a, and the nozzle 249a. An O-containing gas supply system mainly includes the gas supply pipe 232b, the MFC 241b, the valve 243b, and the nozzle 249b. A C-containing gas supply system mainly includes the gas supply pipe 232c, the MFC 241c, the valve 243c, the gas supply pipe 232a, and the nozzle 249a. A N-and-H-containing gas supply system mainly includes the gas supply pipe 232d, the MFC 241d, the valve 243d, the gas supply pipe 232b, and the nozzle 249b. A cleaning gas supply system mainly includes the gas supply pipes 232e and 232f, the MFCs 241e and 241f, and the valves 243e and 243f. The cleaning gas supply system may include the gas supply pipes 232a and 232b and the nozzles 249a and 249b. An additive gas supply system mainly includes the gas supply pipe 232g, the MFC 241g, the valve 243g, the gas supply pipe 232b, and the nozzle 249b. An inert gas supply system mainly includes the gas supply pipes 232h and 232i, the MFCs 241h and 241i, the valves 243h and 243i, the gas supply pipes 232a and 232b, and the nozzles 249a and 249b. As described above, the substrate processing apparatus according to the present embodiments does not include a $F_2$ gas supply system for supplying $F_2$ gas into the process container. That is, the substrate processing apparatus according to the present embodiments includes no $F_2$ gas supply system.

One or all of various supply systems described above may be configured as an integrated-type supply system 248 in which the valves 243a to 243i, the MFCs 241a to 241i, and the like are integrated. The integrated-type supply system 248 is connected to each of the gas supply pipes 232a to 232i so that a supply operation of various kinds of gases into the gas supply pipes 232a to 232i, i.e., opening/closing operation of the valves 243a to 243i, a flow rate adjustment operation by the MFCs 241a to 241i, or the like, is controlled by a controller 121 which will be described later. The integrated-type supply system 248 is configured as an integral type or detachable-type integrated unit, and may be attached to and detached from the gas supply pipes 232a to 232i or the like, so as to perform maintenance, replacement, expansion, or the like of the integrated-type supply system 248, on an integrated unit basis.

An exhaust port 231a configured to exhaust an internal atmosphere of the process chamber 201 is installed below a sidewall of the reaction tube 203. The exhaust port 231a may be installed from a lower portion of the sidewall of the reaction tube 203 to an upper portion thereof, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects an internal pressure of the process chamber 201 and an auto pressure controller (APC) valve 244 as a pressure regulator (pressure regulation part). The APC valve 244 is configured to perform or stop a vacuum exhaust of the interior of the process chamber 201 by opening or closing the valve while operating the vacuum pump 246 and is configured to adjust the internal pressure of the process chamber 201 by adjusting an opening degree of the valve based on pressure information detected by the pressure sensor 245 while operating the vacuum pump 246. An exhaust system mainly includes the exhaust pipe 231, the APC valve 244 and the pressure sensor 245. The exhaust system may include the vacuum pump 246.

The seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads or unloads (transfers) the wafers 200 into or from (out of) the process chamber 201 by moving the seal cap 219 up or down. A shutter 219s as a furnace opening cover capable of hermetically seal the lower end opening of the manifold 209 while moving the seal cap 219 down to unload the boat 217 from the interior of the process chamber 201 is installed under the manifold 209. The shutter 219s is made of a metal material such as, e.g., stainless steel (SUS) or the like, and is formed in a disc shape. An O-ring 220c as a seal member making contact with the lower end portion of the manifold 209 is installed on an upper surface of the shutter 219s. The opening/closing operation (such as an up/down movement operation, a rotational movement operation, or the like) of the shutter 219s is controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat-insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 4:
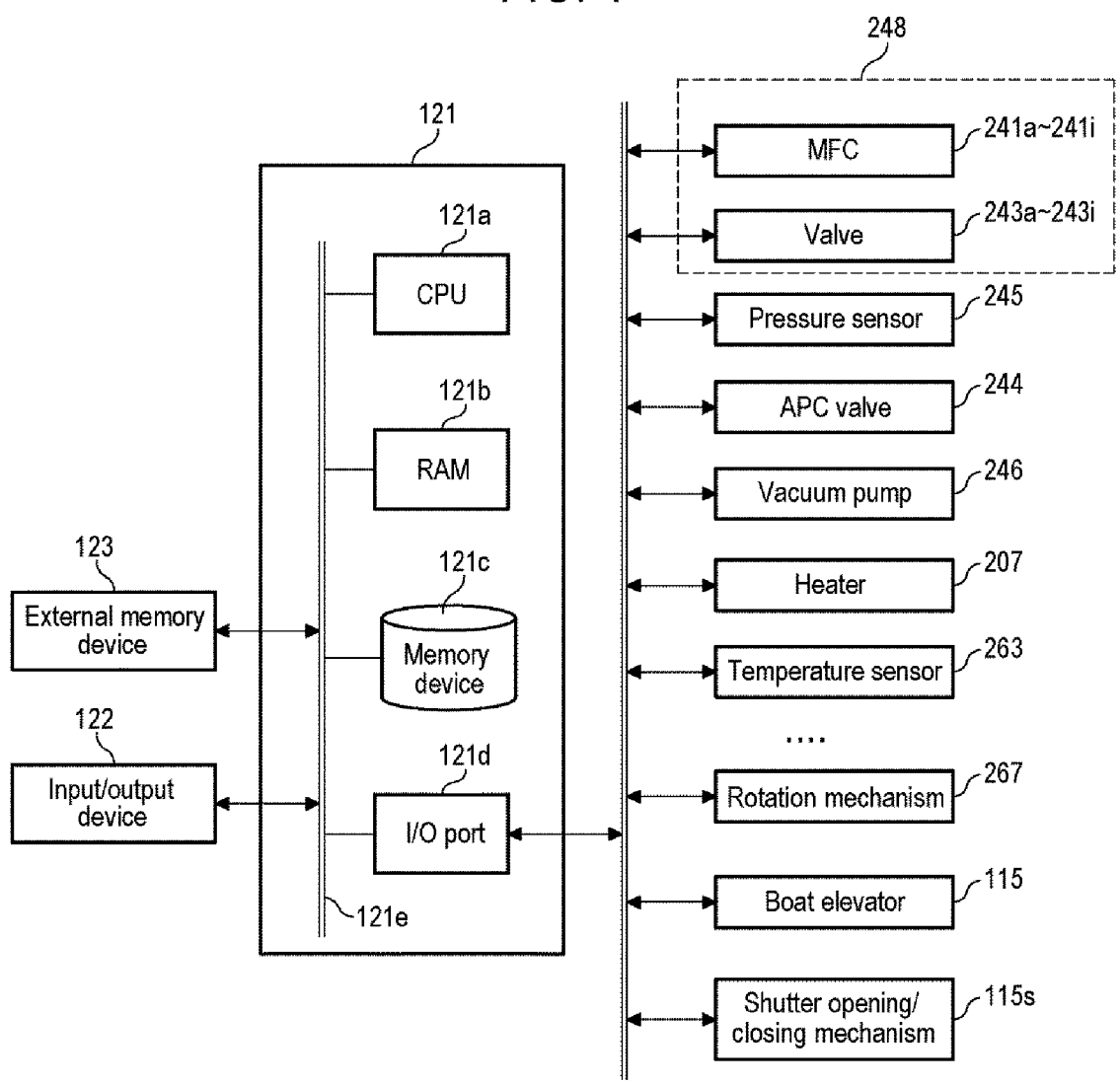
FIG. 4 is a schematic configuration diagram of a controller of the substrate processing apparatus suitably used in some embodiments of the present disclosure, in which a control system of the controller is shown in a block diagram.

As illustrated in FIG. 4, the controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of film formation as described hereinbelow, or a cleaning recipe for specifying sequences and conditions of initial cleaning as described hereinbelow is readably stored in the memory device 121c. The process recipe functions as a program for causing the controller 121 to execute each sequence in the film formation, as described hereinbelow, to obtain a predetermined result. The cleaning recipe functions as a program for causing the controller 121 to execute each sequence in the initial cleaning, as described hereinbelow, to obtain a predetermined result. Hereinafter, the process recipe, the cleaning recipe, and the control program may be generally and simply referred to as a "program." Furthermore, the process recipe or the cleaning recipe may be simply referred to as a "recipe." When the term "program" is used herein, it may indicate a case of including only the recipe, a case of including only the control program, or a case of including both the recipe and the control program. The RAM 121b is configured as a memory area (work area) in which a program, data, and the like read by the CPU 121a is temporarily stored.

The I/O port 121d is connected to the MFCs 241a to 241i, the valves 243a to 243i, the pressure sensor 245, the APC valve 244, the vacuum pump 246, the temperature sensor 263, the heater 207, the rotation mechanism 267, the boat elevator 115, the shutter-opening/closing mechanism 115s, and the like, as described above.

The CPU 121a is configured to read and execute the control program from the memory device 121c. The CPU 121a is also configured to read the recipe from the memory device 121c according to an input and so on of an operation command from the input/output device 122. In addition, the CPU 121a is configured to control, according to the contents of the read recipe, the flow rate adjustment operation of various kinds of gases by the MFCs 241a to 241i, the opening/closing operation of the valves 243a to 243i, the opening/closing operation of the APC valve 244, the pressure regulation operation performed by the APC valve 244 based on the pressure sensor 245, the driving or stopping of the vacuum pump 246, the temperature adjustment operation performed by the heater 207 based on the temperature sensor 263, the operation of rotating the boat 217 with the rotation mechanism 267 and adjusting the rotation speed of the boat 217, the operation of moving the boat 217 up or down by the boat elevator 115, the operation of opening or closing the shutter 219s by the shutter-opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided to the computer using a communication means such as the Internet or a dedicated line, instead of using the external memory device 123.

(2) Substrate Processing

As a process of manufacturing a semiconductor device using the aforementioned substrate processing apparatus, one or more examples of a series of processing sequences including a film-forming sequence of forming a film on a wafer 200 as a substrate will be mainly described with reference to FIGS. 5 and 6. In the following descriptions, the operations of the respective parts constituting the substrate processing apparatus are controlled by the controller 121.

Figure 5:
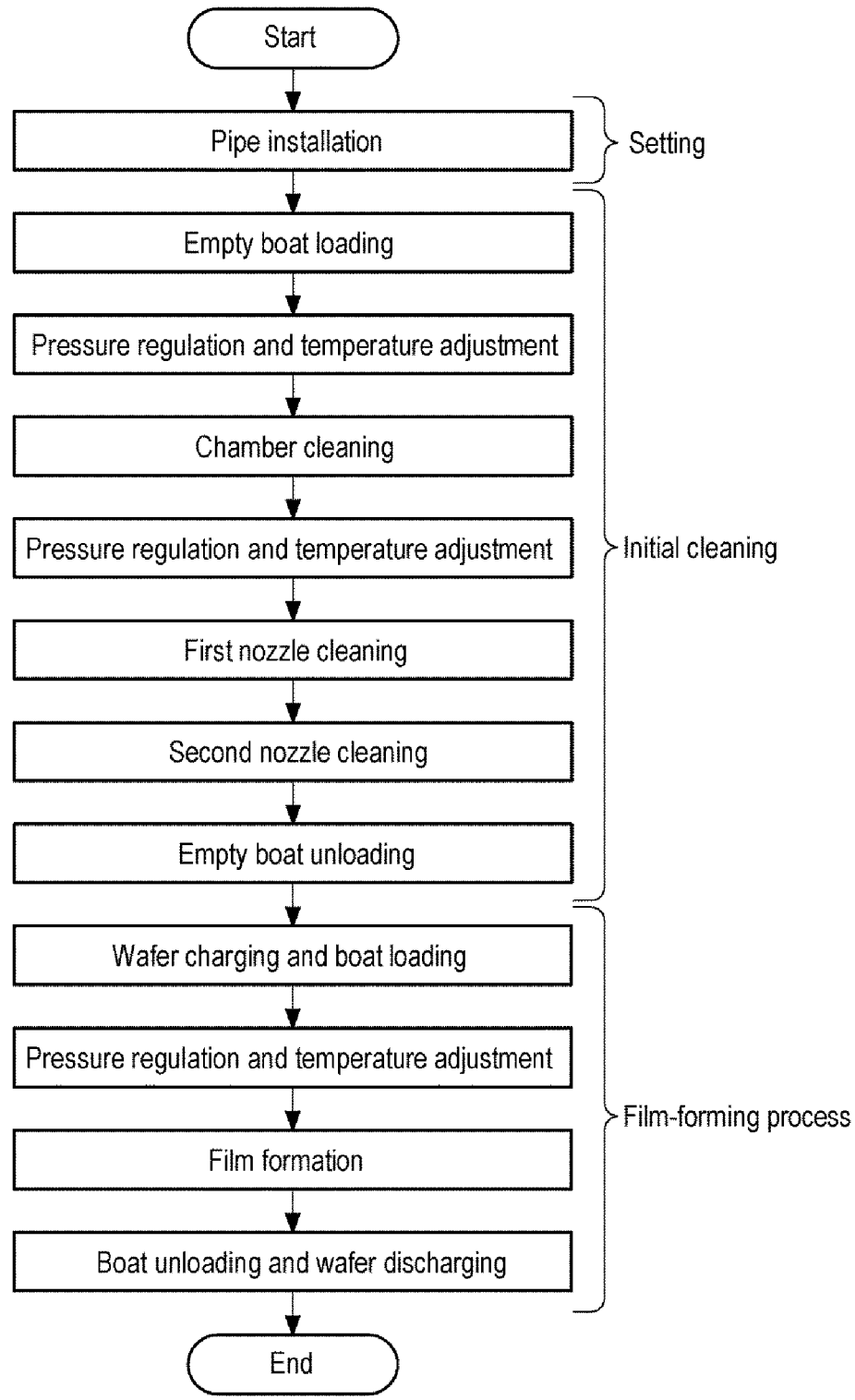
FIG. 5 is a diagram illustrating a substrate processing sequence according to some embodiments of the present disclosure.

In the film formation according to a series of processing sequences illustrated in FIG. 5, a film is formed on a wafer 200 by performing a cycle a predetermined number of times, the cycle including: (a) supplying a precursor gas to the wafer 200 in a process container of a substrate processing apparatus via a gas supply pipe 232a as a first pipe made of metal; (b) supplying an O-containing gas to the wafer 200 in the process container via a gas supply pipe 232b as a second pipe made of metal, wherein a F-containing layer is continuously formed on an inner surface of the second pipe; and (c) supplying a N-and-H-containing gas to the wafer 200 in the process container via the gas supply pipe 232b.

Figure 6:
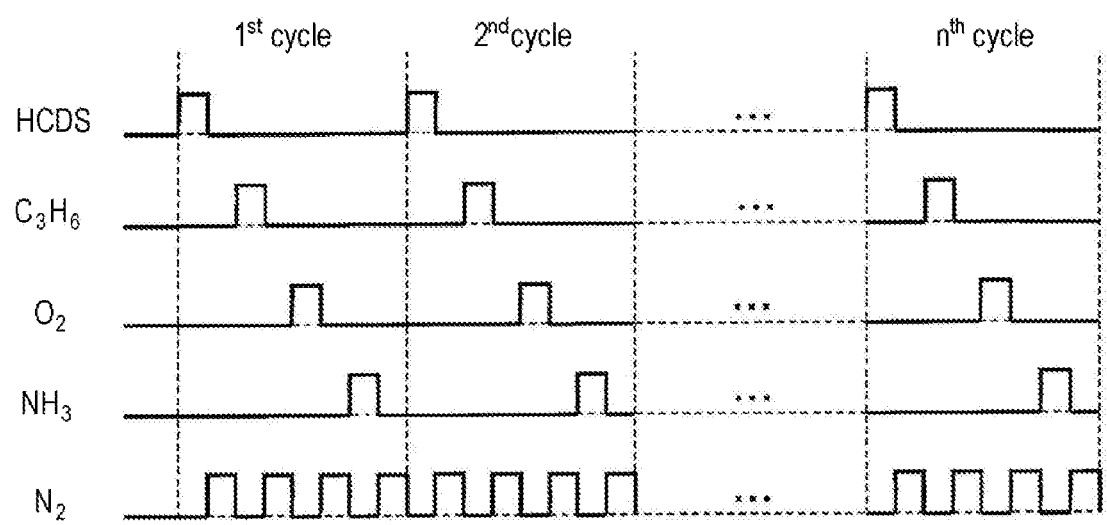
FIG. 6 is a diagram illustrating a gas supply sequence in film formation according to some embodiments of the present disclosure.

Specifically, in the film formation according to the present embodiments, as illustrated in the gas supply sequence in FIG. 6, a film containing Si, O, C, and N, i.e., a silicon oxycarbonitride film (SiOCN film), is formed as the film on the wafer 200 by performing a cycle a predetermined number of times (n times, where n is an integer of 1 or larger), the cycle non-simultaneously performing: Step 1 of supplying HCDS gas as the precursor gas to the wafer 200 in the process container via the gas supply pipe 232a and the nozzle 249a; Step 2 of supplying $C_3H_6$ gas as a C-containing gas to the wafer 200 in the process container via the gas supply pipe 232a and the nozzle 249a; Step 3 of supplying $O_2$ gas as the O-containing gas to the wafer 200 in the process container via the gas supply pipe 232b and the nozzle 249b; and Step 4 of supplying $NH_3$ gas as the N-and-H-containing gas to the wafer 200 in the process container via the gas supply pipe 232b and the nozzle 249b.

In the present disclosure, for the sake of convenience, the gas supply sequence illustrated in FIG. 6, i.e., the film-forming sequence, may be denoted as follows. The same denotation may be used in other embodiments as described hereinbelow.

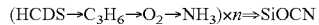

(HCDS→C$_3$H$_6$→O$_2$→NH$_3$)×n⇒SiOCN

When the term "wafer" is used in the present disclosure, it may refer to a wafer itself or a laminated body of a wafer and a predetermined layer or film formed on the surface of the wafer. In addition, when the phrase "a surface of a wafer" is used in the present disclosure, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used in the present disclosure, it may be synonymous with the term "wafer."

Hereinafter, a series of processing sequences illustrated in FIG. 5 will be described in detail.

Setting

First, members such as pipes or the like are set in the substrate processing apparatus. Hereinafter, an operation of installing the pipes including the gas supply pipes 232a and 232b in the substrate processing apparatus will be described.

Pipe Installation

First, the gas supply pipe 232a in which a F-containing layer is not formed on its inner surface and the gas supply pipe 232b in which a F-containing layer is continuously formed on its inner surface are prepared and installed in the substrate processing apparatus. That is, before a film is formed on the wafer 200 (before the film formation), the gas supply pipe 232a in which a F-containing layer is not formed on its inner surface, the gas supply pipe 232b-1 in which a F-containing layer is continuously formed on its inner surface, and the gas supply pipe 232b-2 in which a F-containing layer is continuously formed on its inner surface are prepared, and then incorporated, attached, and installed in the substrate processing apparatus. The formation of the F-containing layer on the respective inner surfaces of the gas supply pipes 232b-1 and 232b-2 is performed as follows.

F-Containing Layer Formation

Before the gas supply pipe 232b (gas supply pipes 232b-1 and 232b-2) is installed in the substrate processing apparatus, a F-containing layer is formed on the respective inner surfaces of the gas supply pipes 232b-1 and 232b-2. That is, before the gas supply pipes 232b-1 and 232b-2 are installed in the substrate processing apparatus, the inner surfaces of the gas supply pipes 232b-1 and 232b-2 are respectively surface-treated by allowing F$_2$ gas, which is a F-containing gas, to flow through the gas supply pipes 232b-1 and 232b-2. In other words, the F$_2$ gas chemically reacts with the respective inner surfaces of the gas supply pipes 232b-1 and 232b-2, to form a continuous F-containing layer on the respective inner surfaces of the gas supply pipes 232b-1 and 232b-2.

Specifically, the F-containing layer is formed on respective inner surfaces separately by supplying the F$_2$ gas to the respective inner surfaces of the gas supply pipes 232b-1 and 232b-2 under different processing conditions suitable for each material, with the gas supply pipes 232b-1 and 232b-2 separated. The processing conditions for forming the F-containing layer on the respective inner surfaces of the gas supply pipes 232b-1 and 232b-2 are as illustrated below. The respective processing conditions illustrated below are conditions under which the F$_2$ gas chemically reacts with the inner surface of the gas supply pipe 232b-1 and the inner surface of the gas supply pipe 232b-2, to form a continuous F-containing layer on the respective inner surfaces of the gas supply pipes 232b-1 and 232b-2.

The processing condition for forming the F-containing layer on the inner surface of the gas supply pipe 232b-1 (the pipe made of SUS) may be exemplified as follows:

Processing temperature: 75 to 200 degrees C.
Processing pressure: 5 to 20,000 Pa
F$_2$ gas supply flow rate: 0.5 to 2 slm
N$_2$ gas supply flow rate: 2 to 8 slm
Supply time of F$_2$ gas: 75 to 400 minutes.

Furthermore, the processing condition for forming the F-containing layer on the inner surface of the gas supply pipe 232b-2 (the pipe made of Hastelloy) may be exemplified as follows:

Processing temperature: 75 to 250 degrees C.
Processing pressure: 5 to 20,000 Pa
F$_2$ gas supply flow rate: 0.5 to 2 slm
N$_2$ gas supply flow rate: 2 to 8 slm
Supply time of F$_2$ gas: 75 to 200 minutes.

Furthermore, in the present disclosure, the expression of the numerical range such as "75 to 200 degrees C." may mean that a lower limit value and an upper limit value are included in that range. Therefore, for example, "75 to 200 degrees C." may mean "75 degrees C. or higher and 200 degrees C. or lower." The same applies to other numerical ranges.

By supplying the F$_2$ gas into each of the gas supply pipe 232b-1 and the gas supply pipe 232b-2 under the aforementioned respective processing conditions, the F$_2$ gas and the respective inner surfaces of the gas supply pipe 232b-1 and the gas supply pipe 232b-2 chemically react with each other, thereby making it possible to form the continuous F-containing layer on the respective inner surfaces of the gas supply pipes 232b-1 and 232b-2. The F-containing layer includes a metal fluoride layer formed by fluorinating metal which is materials of the gas supply pipes 232b-1 and 232b-2. The metal fluoride layer contains iron fluoride (FeF), nickel fluoride (NiF), chromium fluoride (CrF), or the like. The F-containing layer is formed on the respective inner surfaces of the gas supply pipes 232b-1 and 232b-2 such that the materials of the gas supply pipes 232b-1 and 232b-2 are prevented from being exposed inside the respective gas supply pipes 232b-1 and 232b-2. That is, the respective inner surfaces of the gas supply pipes 232b-1 and 232b-2 can be covered with the F-containing layer thereby prevent the materials of the gas supply pipes 232b-1 and 232b-2 from being exposed inside the gas supply pipes 232b-1 and 232b-2.

In the film formation as described hereinbelow, an O-containing gas such as O$_2$ gas and a N-and-H-containing gas such as NH$_3$ gas may react with each other in the gas supply pipe 232b, which is a common pipe for the O$_2$ gas and the NH$_3$ gas, i.e., in the gas supply pipes 232b-1 and 232b-2, to generate water (H$_2$O). Furthermore, the generated water may react with the NH$_3$ gas to generate a substance such as ammonia water (NH$_4$OH) in the gas supply pipe 232b-1 and the gas supply pipe 232b-2. The substance such as ammonia water becomes a factor for corroding the material of the gas supply pipe 232b-1 or 232b-2 to cause damage to the gas supply pipe 232b-1 or 232b-2. In the present embodiments, the corrosion of the inner surfaces of the gas supply pipe 232b-1 and the gas supply pipe 232b-2 and the damage due to the corrosion can be suppressed by using the gas supply pipe 232b-1 and the gas supply pipe 232b-2 in which a continuous F-containing layer is formed on the respective inner surfaces when the film formation is performed. Furthermore, since the $O_2$ gas and the $NH_3$ gas are not mixed and do not react with each other in the gas supply pipe 232a which is not a common pipe for the $O_2$ gas and the $NH_3$ gas, it is possible to reduce the cost by using the pipe in which a F-containing layer is not formed on its inner surface as the gas supply pipe 232a.

The thickness of the F-containing layer formed on the respective inner surfaces of the gas supply pipes 232b-1 and 232b-2 may be set to such a thickness that the substance such as ammonia water generated by the reaction between the $O_2$ gas and the $NH_3$ gas does not chemically react with the inner surfaces of the gas supply pipes 232b-1 and 232b-2 in the gas supply pipes 232b-1 and 232b-2 when the film formation is performed. Specifically, the thickness of the F-containing layer formed on the respective inner surfaces of the gas supply pipes 232b-1 and 232b-2 may be set to such a thickness that the substance such as $NH_4OH$, which is a reactant generated by the reaction between $NH_3$ and $H_2O$ generated by the reaction between $O_2$ and $NH_3$, does not chemically react with the inner surfaces of the gas supply pipes 232b-1 and 232b-2 in the gas supply pipes 232b-1 and 232b-2. More specifically, the thickness of the F-containing layer formed on the respective inner surfaces of the gas supply pipes 232b-1 and 232b-2 may be set to a thickness in a range of, for example, 1 nm to 50 nm, 2 nm to 40 nm in some embodiments, or 2.5 nm to 35 nm in some embodiments.

Furthermore, the thickness of the F-containing layer formed on the respective inner surfaces of the gas supply pipes 232b-1 and 232b-2 may become thicker as the processing temperature is raised, depending on the respective processing temperatures (pipe temperatures) when forming the F-containing layer. However, the F-containing layer may be formed under an optimized processing condition depending on the material of the gas supply pipe 232b, since the inner surfaces of the gas supply pipes 232b-1 and 232b-2 may be corroded if the processing temperature is too high when forming the F-containing layer. Specifically, the processing temperature when forming the F-containing layer on the inner surface of the gas supply pipe 232b-1 may be set lower than the processing temperature when forming the F-containing layer on the inner surface of the gas supply pipe 232b-2. Furthermore, the processing temperature when forming the F-containing layer on the inner surface of the gas supply pipe 232b-1 may be set equal to or higher than the temperature of the gas supply pipe 232b-1 in the film formation as described hereinbelow. In addition, the processing temperature when forming the F-containing layer on the inner surface of the gas supply pipe 232b-2 may be set higher than the temperature of the gas supply pipe 232b-2 in the film formation as described hereinbelow.

Furthermore, as described above, the processing temperature when forming the F-containing layer on the inner surface of the gas supply pipe 232b-1 may be set lower than the processing temperature when forming the F-containing layer on the inner surface of the gas supply pipe 232b-2, and the supply time of the $F_2$ gas when forming the F-containing layer on the inner surface of the gas supply pipe 232b-1 may be set longer than the supply time of the $F_2$ gas when forming the F-containing layer on the inner surface of the gas supply pipe 232b-2. By controlling the balance between the processing temperature and the supply time of the $F_2$ gas when forming the F-containing layer on the respective inner surfaces of the gas supply pipes 232b-1 and 232b-2, the F-containing layer having an appropriate thickness can be formed on the respective inner surfaces of the gas supply pipes 232b-1 and 232b-2 while suppressing the corrosion of the respective inner surfaces of the gas supply pipes 232b-1 and 232b-2.

Initial Cleaning

After the setting is completed and before a film is formed on the wafer 200 (before the film formation), the initial cleaning is performed on the interior of the process chamber 201 and the interiors of the nozzles 249a and 249b by performing the chamber cleaning, the first nozzle cleaning, and the second nozzle cleaning. Hereinafter, a series of operations of the initial cleaning will be described.

Empty Boat Loading

The shutter 219s is moved by the shutter-opening/closing mechanism 115s to open the lower end opening of the manifold 209 (shutter opening). Thereafter, the empty boat 217, i.e., the boat 217 not charged with the wafers 200, is lifted up by the boat elevator 115 to be loaded into the process chamber 201. In this state, the seal cap 219 seals the lower end of the manifold 209 through the O-ring 220b.

Pressure Regulation and Temperature Adjustment

After the loading of the empty boat 217 into the process chamber 201 is completed, the interior of the process chamber 201 is vacuum-exhausted by the vacuum pump 246 to reach a desired pressure (chamber cleaning pressure). Furthermore, the interior of the process chamber 201 is heated by the heater 207 to a desired temperature (chamber cleaning temperature). In this operation, the members in the process chamber 201, i.e., the inner wall of the reaction tube 203, the surfaces of the nozzles 249a and 249b, the surface of the boat 217, and the like, are also heated to the chamber cleaning temperature. In addition, the rotation of the boat 217 by the rotation mechanism 267 is started. The operation of the vacuum pump 246, the heating of the interior of the process chamber 201, and the rotation of the boat 217 may be continuously performed at least until the nozzle cleaning as described hereinbelow is completed. The boat 217 may not be rotated.

Chamber Cleaning

After the internal pressure and temperature of the process chamber 201 are stabilized, the interior of the process chamber 201 is cleaned by supplying $ClF_3$ gas and NO gas into the process chamber 201. Specifically, the valves 243e and 243g are opened to allow $ClF_3$ gas to flow through the gas supply pipe 232e and to allow NO gas to flow through the gas supply pipe 232g. The flow rates of the $ClF_3$ gas and the NO gas are adjusted by the MFCs 241e and 241g, respectively. The $ClF_3$ gas and the NO gas are supplied into the process chamber 201 via the gas supply pipes 232a and 232b and the nozzles 249a and 249b, respectively, and are exhausted through the exhaust port 231a. Simultaneously, the valves 243h and 243i may be opened to supply $N_2$ gas into the process chamber 201 via the nozzles 249a and 249b.

The processing condition in this step may be exemplified as follows:

$ClF_3$ gas supply flow rate: 0.5 to 10 slm

NO gas supply flow rate: 0.5 to 10 slm $N_2$ gas supply flow rate (for each gas supply pipe): 0 to 10 slm Supply time of each gas: 1 to 60 minutes or 10 to 20 minutes in some embodiments Processing temperature (chamber cleaning temperature): 100 to 350 degrees C. or 200 to 300 degrees C. in some embodiments Processing pressure (chamber cleaning pressure): 1,333 to 53,329 Pa or 9,000 to 16,665 Pa in some embodiments.

By supplying the $ClF_3$ gas and the NO gas into the process chamber 201 under the aforementioned processing condition, NO gas can be added to the $ClF_3$ gas, and these gases can be mixed and reacted in the process chamber 201. By this reaction, active species such as, e.g., fluorine radicals (F*) and nitrosyl fluoride (FNO) (hereinafter, these may be generally referred to as FNO or the like), can be generated in the process chamber 201. As a result, a mixed gas obtained by adding FNO or the like to the $ClF_3$ gas exists in the process chamber 201. The mixed gas obtained by adding FNO or the like to the $ClF_3$ gas contacts the members in the process chamber 201, for example, the inner wall of the reaction tube 203, the surfaces of the nozzles 249a and 249b, the surface of the boat 217, and the like. In this operation, deposits adhered to the surfaces of the members in the process chamber 201 can be removed by a thermochemical reaction (etching reaction). FNO or the like acts to promote the etching reaction by the $ClF_3$ gas and to increase the etching rate of the deposits, i.e., acts to assist the etching.

After a predetermined time has passed and the cleaning of the interior of the process chamber 201 is completed, the valves 243e and 243g are closed to stop the supply of the $ClF_3$ gas and the NO gas into the process chamber 201. Then, the interior of the process chamber 201 is vacuum-exhausted and the gas or the like remaining in the process chamber 201 is removed from the interior of the process chamber 201 (purge). In this operation, the valves 243h and 243i are opened to supply $N_2$ gas into the process chamber 201. The $N_2$ gas acts as a purge gas.

As the cleaning gas, it may be possible to use, e.g., hydrogen fluoride (HF) gas, nitrogen fluoride ($NF_3$) gas, $F_2$ gas, or a mixed gas thereof, as well as the $ClF_3$ gas. This applies to the nozzle cleaning as described hereinbelow.

As the additive gas, it may be possible to use, e.g., hydrogen ($H_2$) gas, $O_2$ gas, nitrous oxide ($N_2O$) gas, isopropyl alcohol (($CH_3$)$_2$CHOH, abbreviation: IPA) gas, methanol ($CH_3OH$) gas, water vapor ($H_2O$ gas), HF gas, or a mixed gas thereof, as well as the NO gas.

Furthermore, when the HF gas is used as the additive gas, one of the $F_2$ gas, the $ClF_3$ gas, the $NF_3$ gas, and a mixed gas thereof may be used as the cleaning gas. In addition, when the HF gas is used as the cleaning gas, and one of the IPA gas, the methanol gas, the $H_2O$ gas, and a mixed gas thereof is used as the additive gas, the aforementioned processing temperature may be set to a predetermined temperature in a range of, for example, 30 to 300 degrees C. or 50 to 200 degrees C. in some embodiments.

As the inert gas, it may be possible to use, a rare gas such as Ar gas, He gas, Ne gas, Xe gas, or the like, as well as the $N_2$ gas. The same applies to respective steps as described hereinbelow.

Pressure Regulation and Temperature Adjustment

After the chamber cleaning is completed, the interior of the process chamber 201 is vacuum-exhausted by the vacuum pump 246 to reach a desired pressure (nozzle cleaning pressure). Furthermore, the interiors of the nozzles 249a and 249b are heated by the heater 207 to a desired temperature (nozzle cleaning temperature).

First Nozzle Cleaning

After the internal pressure of the process chamber 201 and the internal temperature of the nozzles 249a and 249b are stabilized, the interior of the nozzle 249a is cleaned by supplying $ClF_3$ gas into the nozzle 249a. Specifically, the valve 243e is opened to allow $ClF_3$ gas to flow through the gas supply pipe 232e. The flow rate of the $ClF_3$ gas is adjusted by the MFC 241e. The $ClF_3$ gas is supplied into the nozzle 249a via the gas supply pipe 232a and flown into the process chamber 201 and is exhausted through the exhaust port 231a. Simultaneously, the valves 243h and 243i may be opened to supply $N_2$ gas into the process chamber 201 via the nozzles 249a and 249b.

The processing condition in this step may be exemplified as follows:

$ClF_3$ gas supply flow rate: 0.5 to 10 slm $N_2$ gas supply flow rate (for each gas supply pipe): 0 to 10 slm Supply time of each gas: 1 to 60 minutes or 10 to 20 minutes in some embodiments Processing temperature (nozzle cleaning temperature): 400 to 500 degrees C. or 400 to 450 degrees C. in some embodiments Processing pressure (nozzle cleaning pressure): 1,333 to 40,000 Pa or 6,666 to 16,665 Pa in some embodiments.

By supplying the $ClF_3$ gas into the nozzle 249a under the aforementioned processing condition, deposits adhered to the interior of the nozzle 249a can be removed by a thermochemical reaction. After a predetermined time has passed and the cleaning of the interior of the nozzle 249a is completed, the valve 243e is closed to stop the supply of the $ClF_3$ gas into the nozzle 249a. Then, the interior of the process chamber 201 is purged in a processing procedure similar to that of the purge in the chamber cleaning described above (purge).

Second Nozzle Cleaning

After the cleaning of the interior of the nozzle 249a is completed, the interior of the nozzle 249b is cleaned by supplying $ClF_3$ gas into the gas supply pipe 232b. Specifically, the valve 243f is opened to allow $ClF_3$ gas to flow through the gas supply pipe 232f. The flow rate of the $ClF_3$ gas is adjusted by the MFC 241f. The $ClF_3$ gas is supplied into the nozzle 249b via the gas supply pipe 232b and flown into the process chamber 201 and is exhausted through the exhaust port 231a. Simultaneously, the valves 243h and 243i may be opened to supply $N_2$ gas into the process chamber 201 via the nozzles 249a and 249b.

The processing condition in this step may be similar to the processing condition in the first nozzle cleaning described above.

By supplying the $ClF_3$ gas into the nozzle 249b under the aforementioned processing condition, deposits adhered to the interior of the nozzle 249b can be removed by a thermochemical reaction. After a predetermined time has passed and the cleaning of the interior of the nozzle 249b is completed, the valve 243f is closed to stop the supply of the $ClF_3$ gas into the nozzle 249b. Then, the interior of the process chamber 201 is purged in a processing procedure similar to that of the purge in the chamber cleaning described above (purge).

After the cleaning of the interior of the nozzle 249b is completed, the internal atmosphere of the process chamber 201 is substituted with an inert gas (inert gas substitution). The internal pressure of the process chamber 201 is returned to an atmospheric pressure (returning to atmospheric pressure).

Empty Boat Unloading

The seal cap 219 is moved down by the boat elevator 115 to open the lower end of the manifold 209. Then, the empty boat 217 is unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing).

Furthermore, prior to performing the boat unloading, the processing of the wafers 200, namely the same process as the film-forming process, may be performed in the process container according to processing procedures and processing conditions similar to those in the film formation as described hereinbelow (pre-coating). By performing the pre-coating, a pre-coating film (SiCON film) containing Si, O, C, and N can be formed on the respective surfaces of the members in the process container. The pre-coating may be performed, for example, in a state where the cleaned empty boat 217 is accommodated in the process container.

The initial cleaning is completed by the series of operations described above. By the initial cleaning, the environment and state in the process container before the film-forming process can be adjusted.

Film-Forming Process

After the initial cleaning is completed, the film-forming process of forming a film on the wafer 200 is performed. Hereinafter, a series of operations of the film-forming process will be described.

Wafer Charging and Boat Loading

After the boat unloading is completed, when a plurality of wafers 200 is charged on the boat 217 (wafer charging), the shutter 219s is moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

Pressure Regulation and Temperature Adjustment

The interior of the process chamber 201, namely the space in which the wafers 200 are located, is vacuum-exhausted (depressurization-exhausted) by the vacuum pump 246 to reach a desired pressure (film-forming pressure). Furthermore, the wafers 200 in the process chamber 201 are heated by the heater 207 to a desired temperature (film-forming temperature). In addition, the rotation of the wafers 200 by the rotation mechanism 267 is initiated. The exhaust of the interior of the process chamber 201 and the heating and rotating the wafers 200 may be all continuously performed at least until the processing of the wafers 200 is completed.

Film Formation

Thereafter, the following steps 1 to 4 are sequentially performed.

Step 1

In this step, HCDS gas is supplied to the wafer 200 in the process container (HCDS gas supplying). Specifically, the valve 243a is opened to allow the HCDS gas to flow through the gas supply pipe 232a. The flow rate of the HCDS gas is adjusted by the MFC 241a. The HCDS gas is supplied into the process chamber 201 via the nozzle 249a and is exhausted through the exhaust port 231a. In this operation, the HCDS gas is supplied to the wafer 200. Simultaneously, the valves 243h and 243i may be opened to supply $N_2$ gas into the process chamber 201 via the nozzles 249a and 249b.

The processing condition in this step may be exemplified as follows:

HCDS gas supply flow rate: 0.01 to 2 slm or 0.1 to 1 slm in some embodiments $N_2$ gas supply flow rate (for each gas supply pipe): 0 to 10 slm Supply time of each gas: 1 to 120 seconds or 1 to 60 seconds in some embodiments Processing temperature: 250 to 800 degrees C. or 400 to 700 degrees C. in some embodiments Processing pressure: 1 to 2,666 Pa or 67 to 1,333 Pa in some embodiments.

By supplying the HCDS gas to the wafer 200 under the aforementioned condition, a Si-containing layer containing Cl is formed as a first layer on the outermost surface of the wafer 200. The Si-containing layer containing Cl is formed by physical adsorption of HCDS on the outermost surface of the wafer 200, chemical adsorption of a substance (hereinafter, $Si_xCl_y$) obtained by decomposing HCDS or a part of HCDS thereon, deposition of Si by thermal decomposition of HCDS thereon, or the like. The Si-containing layer containing Cl may be an adsorption layer (a physical adsorption layer or a chemical adsorption layer) of HCDS or $Si_xCl_y$, or may be a deposited layer of Si containing Cl. In the present disclosure, the Si-containing layer containing Cl may be simply referred to as a Si-containing layer.

After the first layer is formed, the valve 243a is closed to stop the supply of the HCDS gas into the process chamber 201. Then, the interior of the process chamber 201 is vacuum-exhausted and the gas or the like remaining in the process chamber 201 is removed from the interior of the process chamber 201 (purge). In this operation, the valves 243h and 243i are opened to supply $N_2$ gas into the process chamber 201. The $N_2$ gas acts as a purge gas.

As the precursor gas, it may be possible to use, chlorosilane-based gas such as monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, octachlorotrisilane ($Si_3Cl_8$, abbreviation: OCTS) gas, or the like, as well as the HCDS gas.

Step 2

After Step 1 is completed, $C_3H_6$ gas is supplied to the wafer 200 in the process container, namely the first layer formed on the wafer 200 ($C_3H_6$ gas supply). Specifically, the valve 243c is opened to allow $C_3H_6$ gas to flow through the gas supply pipe 232c. The flow rate of the $C_3H_6$ gas is adjusted by the MFC 241c. The $C_3H_6$ gas is supplied into the process chamber 201 via the gas supply pipe 232a and the nozzle 249a and is exhausted through the exhaust port 231a. In this operation, the $C_3H_6$ gas is supplied to the wafer 200. Simultaneously, the valves 243h and 243i may be opened to supply $N_2$ gas into the process chamber 201 via the nozzles 249a and 249b.

The processing condition in this step may be exemplified as follows:

$C_3H_6$ gas supply flow rate: 0.1 to 10 slm

Supply time of $C_3H_6$ gas: 1 to 120 seconds or 1 to 60 seconds in some embodiments Processing pressure: 1 to 6,000 Pa or 1 to 5,000 Pa in some embodiments.

Other processing conditions may be similar to the processing conditions of Step 1.

By supplying the $C_3H_6$ gas to the wafer 200 under the aforementioned condition, a C-containing layer is formed on the first layer, whereby a second layer containing Si and C is formed on the wafer 200.

After the second layer is formed, the valve 243c is closed to stop the supply of the $C_3H_6$ gas into the process chamber 201. Then, the gas or the like, which remains in the process chamber 201, is removed from the interior of the process chamber 201 according to processing procedures similar to those of the purge in Step 1 (purge).

As the reaction gas (C-containing gas), it may be possible to use, hydrocarbon-based gas such as acetylene ($C_2H_2$) gas, ethylene ($C_2H_4$) gas, or the like, as well as the $C_3H_6$ gas.

Step 3

After Step 2 is completed, $O_2$ gas is supplied to the wafer 200 in the process container, namely the second layer formed on the wafer 200 ($O_2$ gas supply). Specifically, the valve 243b is opened to allow the $O_2$ gas to flow through the gas supply pipe 232b. The flow rate of the $O_2$ gas is adjusted by the MFC 241b. The $O_2$ gas is supplied into the process chamber 201 via the nozzle 249b and is exhausted through the exhaust port 231a. In this operation, the $O_2$ gas is supplied to the wafer 200. Simultaneously, the valves 243h and 243i may be opened to supply $N_2$ gas into the process chamber 201 via the nozzles 249a and 249b.

The processing condition in this step may be exemplified as follows:

$O_2$ gas supply flow rate: 0.1 to 10 slm

Supply time of $O_2$ gas: 1 to 120 seconds or 1 to 60 seconds in some embodiments Processing pressure: 1 to 4,000 Pa or 1 to 3,000 Pa in some embodiments.

Other processing conditions may be similar to the processing conditions of Step 1.

By supplying the $O_2$ gas to the wafer 200 under the aforementioned condition, at least a portion of the second layer formed on the wafer 200 is oxidized (modified). By modifying the second layer, a third layer containing Si, O, and C, i.e., a silicon oxycarbide layer (SiOC layer), is formed on the wafer 200. When the third layer is formed, an impurity such as Cl contained in the second layer constitutes a gaseous substance containing at least Cl in the process of the modifying reaction of the second layer by the $O_2$ gas, and is exhausted from the interior of the process chamber 201. Thus, the third layer becomes a layer having fewer impurities such as Cl or the like than the first and second layers.

After the third layer is formed, the valve 243b is closed to stop the supply of the $O_2$ gas into the process chamber 201. Then, the gas or the like, which remains in the process chamber 201, is removed from the interior of the process chamber 201 according to processing procedures similar to those of the purge in Step 1 (purge).

As the reaction gas (O-containing gas), it may be possible to use, for example, ozone ($O_3$) gas, water vapor ($H_2O$ gas), nitrogen monoxide (NO) gas, nitrous oxide ($N_2O$) gas, or the like, as well as the $O_2$ gas.

Step 4

After Step 3 is completed, $NH_3$ gas is supplied to the wafer 200 in the process container, namely the third layer formed on the wafer 200 ($NH_3$ gas supply). Specifically, the valve 243d is opened to allow $NH_3$ gas to flow through the gas supply pipe 232d. The flow rate of the $NH_3$ gas is adjusted by the MFC 241d. The $NH_3$ gas is supplied into the process chamber 201 via the gas supply pipe 232b and the nozzle 249b and is exhausted through the exhaust port 231a. In this operation, the $NH_3$ gas is supplied to the wafer 200. Simultaneously, the valves 243h and 243i may be opened to supply $N_2$ gas into the process chamber 201 via the nozzles 249a and 249b.

The processing condition in this step may be exemplified as follows:

$NH_3$ gas supply flow rate: 0.1 to 10 slm

Supply time of $NH_3$ gas: 1 to 120 seconds or 1 to 60 seconds in some embodiments Processing pressure: 1 to 4,000 Pa or 1 to 3,000 Pa in some embodiments.

Other processing conditions may be similar to the processing conditions of Step 1.

By supplying the $NH_3$ gas to the wafer 200 under the aforementioned condition, at least a portion of the third layer formed on the wafer 200 is nitrided (modified). By modifying the third layer, a fourth layer containing Si, O, C, and N, i.e., a silicon oxycarbonitride layer (SiOCN layer), is formed on the wafer 200. When the fourth layer is formed, an impurity such as Cl contained in the third layer constitutes a gaseous substance containing at least Cl in the process of the modifying reaction of the third layer by the $NH_3$ gas, and is exhausted from the interior of the process chamber 201. Thus, the fourth layer becomes a layer having fewer impurities such as Cl or the like than the third layer.

After the fourth layer is formed, the valve 243d is closed to stop the supply of the $NH_3$ gas into the process chamber 201. Then, the gas or the like, which remains in the process chamber 201, is removed from the interior of the process chamber 201 according to processing procedures similar to those of the purge in Step 1 (purge).

As the reaction gas (N-and-H-containing gas), it may be possible to use, for example, hydrogen nitride-based gas such as diazene ($N_2H_2$) gas, hydrazine ($N_2H_4$) gas, $N_3H_8$ gas, or the like, as well as the $NH_3$ gas.

Performing a Predetermined Number of Times

A cycle which non-simultaneously, i.e., non-synchronously, performs steps 1 to 4 described above is performed a predetermined number of times (n times, where n is an integer of 1 or larger). Thus, a SiOCN film having a predetermined composition and a predetermined thickness can be formed on the wafer 200. The aforementioned cycle may be repeated multiple times. That is, the thickness of the fourth layer formed per one cycle may be set to be smaller than a desired thickness and the aforementioned cycle may be repeated multiple times until the thickness of the SiOCN film formed by laminating the fourth layer becomes equal to the desired film thickness.

After-Purging and Returning to Atmospheric Pressure

After the film formation is completed, the $N_2$ gas as a purge gas is supplied from each of the nozzles 249a and 249b into the process chamber 201 and is exhausted through the exhaust port 231a. Thus, the interior of the process chamber 201 is purged and the gas or the reaction byproduct, which remains in the process chamber 201, is removed from the interior of the process chamber 201 (after-purging). Thereafter, the internal atmosphere of the process chamber 201 is substituted by an inert gas (inert gas substitution). The internal pressure of the process chamber 201 is returned to an atmospheric pressure (returning to atmospheric pressure).

Boat Unloading and Wafer Discharging

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects according to the Present Embodiment

According to the present embodiments, one or more effects as set forth below may be achieved.

(a) By supplying the $O_2$ gas and the $NH_3$ gas using the pipe in which the F-containing layer is formed on its inner surface, it is possible to improve the quality of the SiOCN film formed on the wafer 200, i.e., the quality of the film-forming process.

Figure 7A:
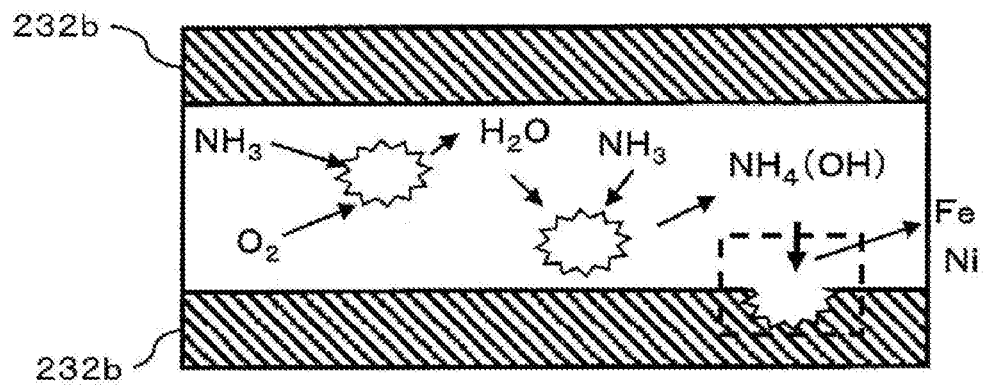
FIG. 7A is a schematic cross sectional view illustrating a reaction occurring in a second pipe made of metal, in which a fluorine-containing layer is not formed on an inner surface of the second pipe.

As described above, this is because, when the aforementioned film formation is performed, the $O_2$ gas remaining in the gas supply pipe 232b at the start of Step 4 may react with the $NH_3$ gas supplied into the gas supply pipe 232b by performing Step 4 to generate water ($H_2O$) in the gas supply pipe 232b. Furthermore, ammonia water ($NH_4OH$) or the like may be generated in the gas supply pipe 232b by the reaction between the water and the $NH_3$ gas. If the F-containing layer is not formed on the inner surface of the gas supply pipe 232b, the ammonia water generated in the gas supply pipe 232b becomes a factor for corroding the inner surface to generate foreign substances containing Fe or Ni (metal particles, hereinafter, also simply referred to as particles) in the gas supply pipe 232b. The state of this reaction is shown in FIG. 7A. The particles generated in the gas supply pipe 232b may diffuse into the process chamber 201 and adsorb on the surface of the wafer 200, thereby deteriorating the quality of the SiOCN film formed on the wafer 200.

Figure 7B:
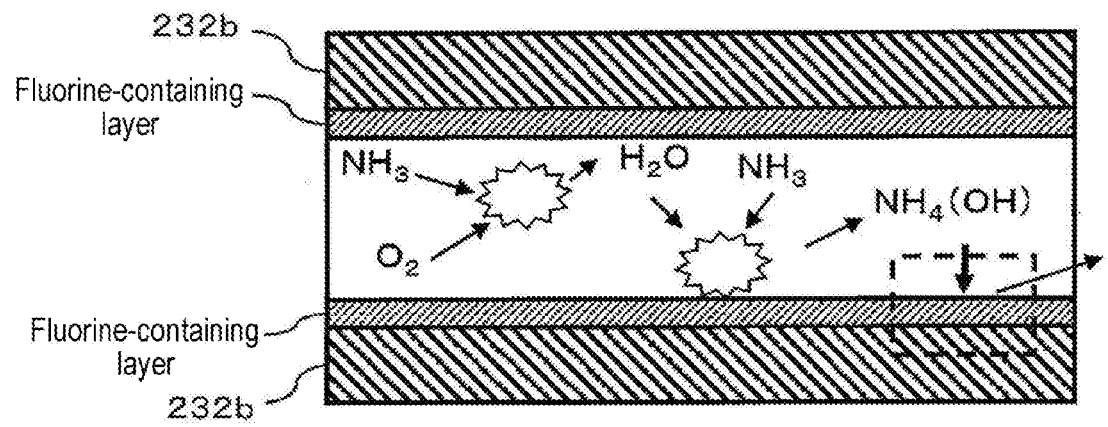
FIG. 7B is a schematic cross sectional view illustrating a reaction occurring in the second pipe made of metal, in which a fluorine-containing layer is formed on the inner surface of the second pipe.

On the other hand, in the present embodiments, the $NH_3$ gas and the $O_2$ gas are supplied by using the gas supply pipe 232b (gas supply pipes 232b-1 and 232b-2) in which the F-containing layer, specifically, the metal fluoride layer, is formed on its inner surface. The F-containing layer formed on the inner surface of the gas supply pipe 232b functions as a so-called passivation layer or a passivating layer (passive layer). By the action of the F-containing layer, even when the ammonia water is generated in the gas supply pipe 232b, it is possible to suppress the corrosion of the inner surface of the gas supply pipe 232b. The state of this reaction is shown in FIG. 7B. Thus, it is possible to suppress the generation of particles in the gas supply pipe 232b, and as a result, to improve the quality of the SiOCN film formed on the wafer 200. Furthermore, since the $O_2$ gas and the $NH_3$ gas are not mixed and do not react with each other in the gas supply pipe 232a, which is not a common pipe for the $O_2$ gas and the $NH_3$ gas, the corrosion of the inner surface of the gas supply pipe 232a due to the reaction between the $O_2$ gas and the $NH_3$ gas does not occur. Thus, it is possible to reduce the cost by using the pipe in which the F-containing layer is not formed on its inner surface as the gas supply pipe 232a.

(b) By allowing the F-containing layer formed on the respective gas supply pipes 232b-1 and 232b-2 to become a continuous layer and by preventing the materials of the respective gas supply pipes 232b-1 and 232b-2 from being exposed inside the gas supply pipes 232b-1 and 232b-2, it is possible to reliably suppress the corrosion of the respective inner surfaces of the gas supply pipes 232b-1 and 232b-2. As a result, it is possible to reliably improve the quality of the film-forming process.

(c) By setting the thickness of the F-containing layer formed on the respective gas supply pipes 232b-1 and 232b-2 to such a thickness that the ammonia water which is a reactant generated in the respective gas supply pipes 232b-1 and 232b-2 and the respective inner surfaces of the gas supply pipes 232b-1 and 232b-2 do not chemically react with each other, it is possible to more reliably suppress the corrosion of the inner surfaces of the gas supply pipes 232b-1 and 232b-2. As a result, it is possible to more reliably improve the quality of the film-forming process.

Furthermore, if the thickness of the F-containing layer is less than 1 nm, the inner surfaces of the gas supply pipes 232b-1 and 232b-2 may chemically react with the ammonia water to be corroded. By setting the thickness of the F-containing layer to 1 nm or greater, it is possible to avoid the corrosion due to the chemical reaction between the ammonia water and the inner surfaces of the gas supply pipes 232b-1 and 232b-2. By setting the thickness of the F-containing layer to 2 nm or greater, it is possible to reliably achieve the aforementioned effects. By setting the thickness of the F-containing layer to 2.5 nm or greater, it is possible to more reliably achieve the aforementioned effects. In addition, if the thickness of the F-containing layer exceeds 50 nm, the corrosion of the inner surfaces of the gas supply pipes 232b-1 and 232b-2 by the $F_2$ gas proceeds, which may result in cracks or delamination in the F-containing layer. By setting the thickness of the F-containing layer to 50 nm or smaller, it is possible to suppress the occurrence of cracks or delamination in the F-containing layer due to the corrosion of the inner surfaces of the gas supply pipes 232b-1 and 232b-2 by the $F_2$ gas. By setting the thickness of the F-containing layer to 40 nm or smaller, it is possible to reliably achieve the aforementioned effects. By setting the thickness of the F-containing layer to 35 nm or smaller, it is possible to more reliably achieve the aforementioned effects.

(d) By forming the F-containing layer on the respective inner surfaces of the gas supply pipes 232b-1 and 232b-2 before installing the gas supply pipes 232b-1 and 232b-2 in the substrate processing apparatus, the F-containing layer having an optimum thickness can be formed on the respective inner surfaces of the pipes separately under different conditions (under respective optimum conditions) in a state in which the respective pipes are separated, when the gas supply pipe 232b includes the gas supply pipe 232b-1 as the pipe made of SUS and the gas supply pipe 232b-2 as the pipe made of Hastelloy, which are different in material, as in the present embodiments. That is, the pipes made of different materials in which the F-containing layer is formed on the respective inner surfaces under respective optimum conditions can be used at a position near the process container and a position far from the process container.

As described above, this is because, after the pipe made of SUS and the pipe made of Hastelloy in which the F-containing layer is not formed on the respective inner surfaces are installed in the substrate processing apparatus including the $F_2$ gas supply system configured to supply the $F_2$ gas into the process container, when the F-containing layer is formed on the respective inner surfaces of the pipes in-situ (when the formation of the F-containing layer on the respective inner surfaces of the pipes and the film-forming process are performed in the same apparatus), since the respective inner spaces of the pipes are adjacent to and in fluid communication with each other, the processing conditions such as the supply time of the $F_2$ gas or the like cannot be changed according to the materials of the pipes. That is, the F-containing layer cannot be formed separately on the respective inner surfaces of the pipe made of SUS and the pipe made of Hastelloy under respective optimum conditions. In such a case, the F-containing layer on the respective inner surfaces of the pipe made of SUS and the pipe made of Hastelloy may be formed under the same conditions simultaneously.

On the other hand, in the present embodiments, in a state in which the respective pipes are separated before installing the pipe made of SUS and the pipe made of Hastelloy in the substrate processing apparatus, the F-containing layer having an optimum thickness can be formed on the respective inner surfaces under the optimum conditions of the respective pipes. That is, in the present embodiments, since the process of forming the F-containing layer is performed ex-situ (since the formation of the F-containing layer on the inner surfaces of the pipe and the film-forming process are performed in different apparatuses), the F-containing layer can be formed on the respective inner surfaces of the pipes made of different materials under respective optimum conditions in a state in which the respective pipes are separated. In addition, in the present embodiments, since the process of forming the F-containing layer is performed ex-situ, the present embodiments can be applied to a substrate processing apparatus not including the $F_2$ gas supply system. Of course, the present embodiments may also be applied to a substrate processing apparatus including the $F_2$ gas supply system.

(e) By performing the chamber cleaning before performing the film formation, it is possible to enhance the cleanliness in the process container and to further improve the quality of the film-forming process performed in the process chamber 201.

(f) By performing the first and second nozzle cleanings before performing the film formation, it is possible to enhance the cleanliness in the nozzles and to further improve the quality of the film-forming process performed in the process chamber 201.

(g) By performing the chamber cleaning and the first and second nozzle cleanings before performing the film formation, it is possible to enhance the cleanliness in the process container and the nozzles, and as a result, to further improve the quality of the film-forming process performed in the process chamber 201. Furthermore, by sequentially performing the chamber cleaning and the first and second nozzle cleanings before performing the film formation as in the present embodiments, it is possible to shorten the total temperature increasing/decreasing time in the process container and to avoid a decrease in productivity of substrate processing.

(h) By performing the pre-coating before performing the film formation, it is possible to adjust the environment and conditions in the process chamber 201 before the film formation. Furthermore, it is possible to suppress the generation of particles in the process chamber 201. As a result, it is possible to further improve the quality of the film-forming process performed in the process chamber 201.

(i) The generation of particles due to the corrosion of the inner surface of the gas supply pipe 232b by the aforementioned ammonia water is particularly noticeable when the film formation is performed using the new (unused) gas supply pipe 232b, for example, when the film formation is performed after operating the substrate processing apparatus or when the film formation is performed after replacing the gas supply pipe 232b. On the other hand, when the film formation is performed using the used gas supply pipe 232b, particles due to such corrosion are unlikely to occur. This is considered to be because, as using the gas supply pipe 232b, the inner surface of the gas supply pipe 232b completely reacts with the ammonia water and this reaction is saturated. Furthermore, the particles due to such corrosion hardly occur on the inner surface of the manifold 209, the surface of the seal cap 219, or the surface of the rotary shaft 255, and tend to be significantly generated on the inner surface of the gas supply pipe 232b. This is considered to be caused by a difference in a degree of mixing or concentration of the $O_2$ gas and the $NH_3$ gas between the interior of the process container and the interior of the gas supply pipe 232b. From these viewpoints, it can be said that the present embodiments is particularly significant when the film formation is performed using the new gas supply pipe 232b.

(j) According to the present embodiments, by forming the F-containing layer on the inner surface of the gas supply pipe 232b, it is possible not only to suppress the damage due to the corrosion of the inner surface of the gas supply pipe 232b by the ammonia water, but also to recovery the damage when the inner surface of the gas supply pipe 232b is damaged in an initial state.

(k) The aforementioned effects by the formation of the F-containing layer on the inner surface of the gas supply pipe 232b can be maintained, until the gas supply pipe 232b is replaced next time, after the gas supply pipe 232b in which the F-containing layer is formed on the inner surface is installed in the substrate processing apparatus.

(l) According to the present embodiments, by supplying the $O_2$ gas and the $NH_3$ gas via the common pipe, it is possible to reduce the number of pipes and to reduce the cost, compared with the case of supplying the $O_2$ gas and the $NH_3$ gas via different pipes. Moreover, the maintenance becomes easy.

(m) The effects of the present embodiments can be similarly achieved even when a F-containing gas other than the $F_2$ gas is used to form the F-containing layer on the inner surface of the gas supply pipe 232b.

(n) The effects of the present embodiments can be similarly achieved even when a precursor gas other than the HCDS gas is used, when a C-containing gas other than the $C_3H_6$ gas is used, when an O-containing gas other than the $O_2$ gas is used, when a N-and-H-containing gas other than the $NH_3$ gas is used, when a cleaning gas other than the $ClF_3$ gas is used, when an additive gas other than the NO gas is used, or when an inert gas other than the $N_2$ gas is used.

Other Embodiments of the Present Disclosure

While some embodiments of the present disclosure have been described in detail above, the present disclosure is not limited to the aforementioned embodiments but may be differently modified without departing from the spirit of the present disclosure.

In the aforementioned embodiments, the processing sequence of sequentially performing setting, chamber cleaning, first nozzle cleaning, second nozzle cleaning, pre-coating, and the film formation has been illustrated, but any step of chamber cleaning, first nozzle cleaning, second nozzle cleaning, and pre-coating may not be performed, as illustrated in (1) to (7) below. Even in these cases, the same effects as those of the aforementioned embodiments described with reference to FIGS. 5 and 6 may be achieved.

(1) Setting→film formation
(2) Setting→chamber cleaning→film formation
(3) Setting→first nozzle cleaning→second nozzle cleaning→film formation
(4) Setting→chamber cleaning→first nozzle cleaning→second nozzle cleaning→film formation
(5) Setting→pre-coating→film formation
(6) Setting→chamber cleaning→pre-coating→film formation
(7) Setting→first nozzle cleaning→second nozzle cleaning→pre-coating→film formation Furthermore, in the film formation, a film may be formed on the wafer 200 by the gas supply sequences illustrated below. Even in these cases, when an O-containing gas such as $O_2$ gas and a N-and-H-containing gas such as $NH_3$ gas are supplied from the gas supply pipe 232b, ammonia water may be generated in the gas supply pipe 232b. Even in these cases, by applying the method of the present disclosure, the same effects as those of the aforementioned embodiments described with reference to FIGS. 5 and 6 may be achieved. The C-containing gas such as the $C_3H_6$ gas is not limited as being supplied from the gas supply pipe 232a and the nozzle 249a, but may be supplied from the gas supply pipe 232b and the nozzle 249b. Even in this case, the same effects as those of the aforementioned embodiments described with reference to FIGS. 5 and 6 may be achieved.

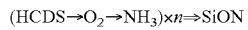

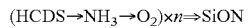

Furthermore, in the aforementioned embodiments, there have been described some examples in which the gas supply pipe 232b for supplying the $O_2$ gas and the $NH_3$ gas includes the gas supply pipe 232b-1 made of SUS and the gas supply pipe 232b-2 made of Hastelloy. However, the present disclosure is not limited thereto and any of the pipe made of SUS, the pipe made of Hastelloy, a pipe made of Inconel, and other pipes made of metal may be used as the gas supply pipes 232b-1 and 232b-2, and the materials of the respective pipes may be equal or different.

Recipes used in each processing may be prepared individually according to the processing contents and may be stored in the memory device 121c via a telecommunication line or the external memory device 123. Moreover, at the start of each processing, the CPU 121a may properly select an appropriate recipe from the recipes stored in the memory device 121c according to the processing contents. Thus, it is possible for a single substrate processing apparatus to form films of different kinds, composition ratios, qualities, and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described some examples in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, each processing may be performed by the processing procedures and processing conditions similar to those of the aforementioned embodiments. Effects similar to those of the aforementioned embodiments may be achieved.

The embodiments described above may be appropriately combined with one another. The processing procedures and processing conditions in this operation may be similar to, for example, the processing procedures and processing conditions of the aforementioned embodiments.

Embodiment Example 1

A pipe made of SUS and a pipe made of Hastelloy are prepared, and in a state in which the respective pipes are separated, a metal fluoride layer was formed on respective inner surfaces of the pipes separately under a plurality of different conditions (conditions 1 to 3). Then, the pipe made of SUS and the pipe made of Hastelloy in which the metal fluoride layer was formed on the respective inner surfaces under the conditions 1 to 3 were installed respectively as the gas supply pipes 232b-1 and 232b-2 illustrated in FIG. 2 in the substrate processing apparatus illustrated in FIG. 1. Then, a SiOCN film was formed on a wafer by the film-forming sequence illustrated in FIG. 6 using the substrate processing apparatus.

Pipe temperatures (processing temperatures) and supply times of $F_2$ gas according to the conditions 1 to 3 for forming the metal fluoride layer on the respective inner surface of the pipe made of SUS and the pipe made of Hastelloy were set as illustrated in FIG. 8. Other processing conditions were set to predetermined conditions which fall within the processing condition ranges described in the aforementioned embodiments.

Then, thicknesses of the metal fluoride layer formed on the respective inner surfaces of the pipe made of SUS and the pipe made of Hastelloy and damages due to corrosion of the respective inner surfaces of the pipe made of SUS and the pipe made of Hastelloy after performing a film-forming process on the wafer a predetermined number of times were observed under the conditions 1 to 3. The results are shown in FIG. 8. The "Thickness of metal fluoride layer" in FIG. 8 indicates a result of determination as "O" when the thickness of the metal fluoride layer formed on the respective inner surfaces of the pipes has reached a target thickness, and as "X" when the thickness has not reached the target thickness. Furthermore, in the present Embodiment Example, the target thickness of the metal fluoride layer formed on the inner surface of the pipe made of SUS was set to 30 to 40 nm, and the target thickness of the metal fluoride layer formed on the inner surface of the pipe made of Hastelloy was set to 10 to 20 nm. In addition, "Pipe damage after film formation" in FIG. 8 indicates a result of determination as "O" when there is no damage due to the corrosion of the inner surface of the pipe after performing the film-forming process a predetermined number of times, and as "X" when there is damage.

As shown in FIG. 8, when the pipe made of SUS is used as the gas supply pipe for supplying the $O_2$ gas and the $NH_3$ gas, it was confirmed that, by setting the pipe temperature when forming the metal fluoride layer at 150 to 180 degrees C. and the supply time of the $F_2$ gas to 200 to 400 minutes, it is possible to form the metal fluoride layer having the target thickness, e.g., 30 to 40 nm, on the inner surface of the pipe made of SUS and to suppress the damage due to the corrosion of the inner surface of the pipe made of SUS.

Furthermore, when the pipe made of Hastelloy is used as the gas supply pipe for supplying the $O_2$ gas and the $NH_3$ gas, it was confirmed that, by setting the pipe temperature when forming the metal fluoride layer at 200 to 250 degrees C. and the supply time of the $F_2$ gas to 100 to 200 minutes, it is possible to form the metal fluoride layer having the target thickness, e.g., 10 to 20 nm, on the inner surface of the pipe made of Hastelloy and to suppress the damage due to the corrosion of the inner surface of the pipe made of Hastelloy.

That is, the metal fluoride layer having the target thickness could be formed and no pipe damage due to corrosion was observed in the pipe made of Hastelloy, by setting the processing temperature at, for example, 200 to 250 degrees C. and the supply time of the $F_2$ gas to, for example, 100 to 200 minutes when forming the metal fluoride layer. However, in the pipe made of SUS, the metal fluoride layer having the target thickness could not be formed and the pipe damage due to corrosion was observed, even if the processing temperature was set to 200 to 250 degrees C. and the supply time of the $F_2$ gas was set to 100 to 200 minutes when forming the metal fluoride layer. That is, it was confirmed that the metal fluoride layer may be formed on the inner surface of the pipe under an optimum condition according to the material of the pipe as the common pipe for supplying the $O_2$ gas and the $NH_3$ gas. Specifically, it was confirmed that, for example, the pipe temperature when forming the metal fluoride layer on the pipe made of SUS may be set lower than the pipe temperature when forming the metal fluoride layer on the pipe made of Hastelloy, and the supply time of the $F_2$ gas when forming the metal fluoride layer on the pipe made of SUS may be set longer than the supply time of the $F_2$ gas when forming the metal fluoride layer on the pipe made of Hastelloy.

According to the present disclosure in some embodiments, it is possible to improve the quality of substrate processing performed in the process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate by performing a cycle a predetermined number of times, the cycle including:
        (a) supplying a precursor gas to the substrate in a process container of a substrate processing apparatus via a first pipe made of metal;
        (b) supplying an oxygen-containing gas to the substrate in the process container via a second pipe made of metal, wherein a fluorine-containing layer is continuously formed on an inner surface of the second pipe; and
        (c) supplying a nitrogen-and-hydrogen-containing gas to the substrate in the process container via the second pipe;
    installing the second pipe made of metal in which the fluorine-containing layer is continuously formed on the inner surface of the second pipe in the substrate processing apparatus, before performing the act of forming the film on the substrate; and
    forming the fluorine-containing layer on the inner surface of the second pipe, before performing the act of installing the second pipe in the substrate processing apparatus,
    wherein the fluorine-containing layer is formed by a chemical reaction between a fluorine-containing gas and the inner surface of the second pipe, and
    wherein the second pipe includes a first part which includes a first material and a second part which includes a second material, and a formation of the fluorine-containing layer on an inner surface of the first part and a formation of the fluorine-containing layer on an inner surface of the second part are performed separately under different conditions, with the first part and the second part separated.

2. The method according to claim 1, wherein the fluorine-containing layer is formed on the inner surface of the second pipe such that a material of the second pipe is prevented from being exposed inside the second pipe.

3. The method according to claim 1, wherein the fluorine-containing layer has a thickness such that the inner surface of the second pipe is prevented from causing a chemical reaction with a substance generated by a reaction between the oxygen-containing gas and the nitrogen-and-hydrogen-containing gas in the second pipe in the act of forming the film on the substrate.

4. The method according to claim 3, wherein H2O is generated by the reaction between the oxygen-containing gas and the nitrogen-and-hydrogen-containing gas, and the substance includes NH4OH generated by a reaction between the H2O and the nitrogen-and-hydrogen-containing gas.

5. The method according to claim 1, wherein the fluorine-containing layer has a thickness in a range of 1 nm to 50 nm.

6. The method according to claim 1, wherein the fluorine-containing layer is a metal fluoride layer.

7. The method according to claim 1, further comprising installing the first pipe made of metal in which the fluorine-containing layer is not formed on an inner surface of the first pipe in the substrate processing apparatus, before performing the act of forming the film on the substrate.

8. The method according to claim 7, further comprising cleaning an interior of the process container by supplying a cleaning gas into the process container, after performing the act of installing the second pipe in the substrate processing apparatus and the act of installing the first pipe in the substrate processing apparatus, and before performing the act of forming the film on the substrate.

9. The method according to claim 1, wherein the first material contains Fe, Ni, and Cr, the second material contains Fe, Ni, Cr, and Mo, and
wherein a temperature of the first part when forming the fluorine-containing layer on the inner surface of the first part is set to be lower than a temperature of the second part when forming the fluorine-containing layer on the inner surface of the second part.

10. The method according to claim 1, wherein the first material contains Fe, Ni, and Cr, the second material contains Fe, Ni, Cr, and Mo, and
wherein a supply time of the fluorine-containing gas when forming the fluorine-containing layer on the inner surface of the first part is set to be longer than a supply time of the fluorine-containing gas when forming the fluorine-containing layer on the inner surface of the second part.

11. The method according to claim 1, wherein the first part is disposed at a position farther from the process container than the second part and the second part is disposed at a position closer to the process container than the first part, in a state where the second pipe is installed in the substrate processing apparatus.

12. The method according to claim 1, wherein the fluorine-containing gas includes F2 gas.

13. The method according to claim 12, wherein the substrate processing apparatus does not include a F2 gas supply system configured to supply F2 gas into the process container.

14. The method according to claim 1, wherein the cycle further includes supplying a carbon-containing gas to the substrate in the process container via the first pipe or the second pipe.

15. A substrate processing apparatus, comprising:
a process container in which a substrate is processed;
a precursor gas supply system configured to supply a precursor gas to the substrate in the process container via a first pipe made of metal;
an oxygen-containing gas supply system configured to supply an oxygen-containing gas to the substrate in the process container via a second pipe made of metal, wherein a fluorine-containing layer is continuously formed on an inner surface of the second pipe;
a nitrogen-and-hydrogen-containing gas supply system configured to supply a nitrogen-and-hydrogen-containing gas to the substrate in the process container via the second pipe; and
a controller configured to control the precursor gas supply system, the oxygen-containing gas supply system, and the nitrogen-and-hydrogen-containing gas supply system to perform a process, the process comprising:
forming a film on the substrate by performing a cycle a predetermined number of times, the cycle including:
(a) supplying the precursor gas to the substrate in the process container via the first pipe;
(b) supplying the oxygen-containing gas to the substrate in the process container via the second pipe; and
(c) supplying the nitrogen-and-hydrogen-containing gas to the substrate in the process container via the second pipe,
wherein the second pipe made of metal in which the fluorine-containing layer is continuously formed on the inner surface of the second pipe is installed in the substrate processing apparatus, before performing the act of forming the film on the substrate,
wherein the fluorine-containing layer is formed on the inner surface of the second pipe, before installing the second pipe in the substrate processing apparatus, wherein the fluorine-containing layer is formed by a chemical reaction between a fluorine-containing gas and the inner surface of the second pipe, and
wherein the second pipe includes a first part which includes a first material and a second part which includes a second material, and a formation of the fluorine-containing layer on an inner surface of the first part and a formation of the fluorine-containing layer on an inner surface of the second part are performed separately under different conditions, with the first part and the second part separated.

16. A method of processing a substrate, comprising:
forming a film on the substrate by performing a cycle a predetermined number of times, the cycle including:
(a) supplying a precursor gas to the substrate in a process container of a substrate processing apparatus via a first pipe made of metal;
(b) supplying an oxygen-containing gas to the substrate in the process container via a second pipe made of metal, wherein a fluorine-containing layer is continuously formed on an inner surface of the second pipe; and
(c) supplying a nitrogen-and-hydrogen-containing gas to the substrate in the process container via the second pipe;
installing the second pipe made of metal in which the fluorine-containing layer is continuously formed on the inner surface of the second pipe in the substrate processing apparatus, before performing the act of forming the film on the substrate; and
forming the fluorine-containing layer on the inner surface of the second pipe, before performing the act of installing the second pipe in the substrate processing apparatus,
wherein the fluorine-containing layer is formed by a chemical reaction between a fluorine-containing gas and the inner surface of the second pipe, and
wherein the second pipe includes a first part which includes a first material and a second part which includes a second material, and a formation of the fluorine-containing layer on an inner surface of the first part and a formation of the fluorine-containing layer on an inner surface of the second part are performed separately under different conditions, with the first part and the second part separated.

* * * * *